Figure 1:
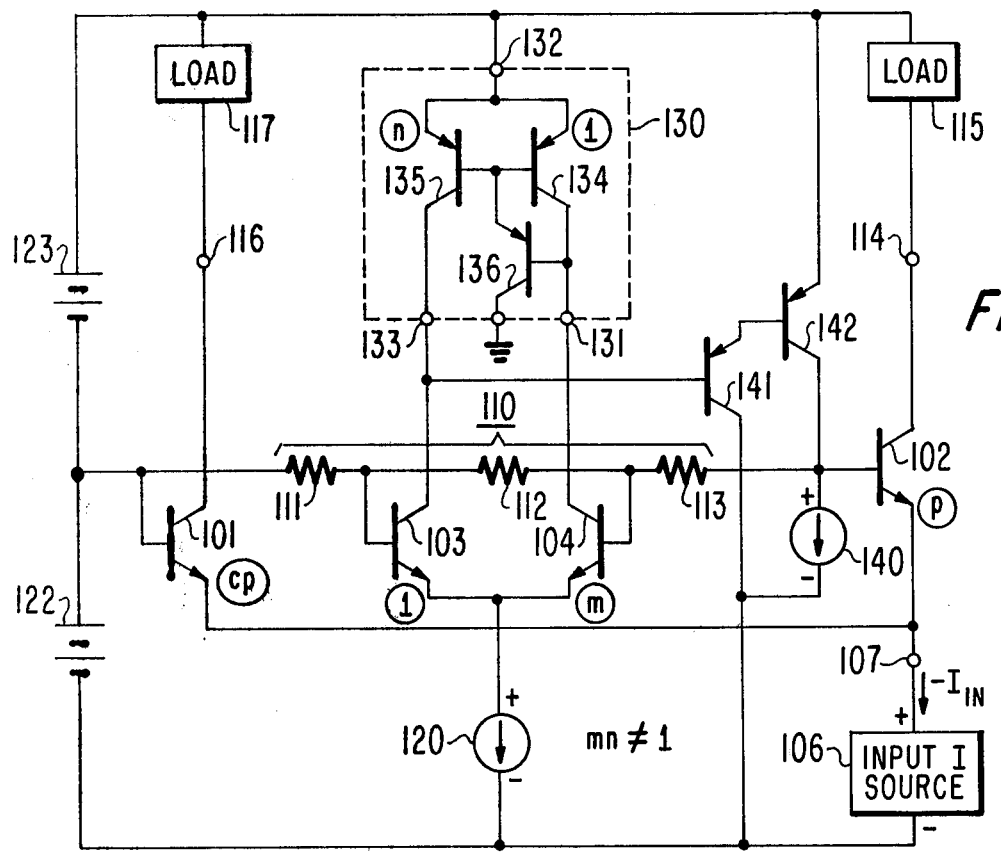

United States Patent [19]

Ahmed

[11] 4,045,694
[45] Aug. 30, 1977

[54] CURRENT DIVIDER

[75] Inventor: Adel Abdel Aziz Ahmed, Annandale, N.J.

[73] Assignee: RCA Corporation, New York, N.Y.

[21] Appl. No.: 690,654

[22] Filed: May 27, 1976

[30] Foreign Application Priority Data

Sept. 26, 1975 United Kingdom ............... 39620/75

[51] Int. Cl.² .......................... H03K 1/00; G05F 3/08
[52] U.S. Cl. ................................ 307/296 R; 307/229; 330/22; 330/40; 323/4
[58] Field of Search ............... 307/296, 297, 229, 271, 307/310; 330/22, 40, 15; 323/4

[56] References Cited

U.S. PATENT DOCUMENTS 3,852,678  12/1974  Frye ....................................... 330/15
3,867,685  2/1975  Ahmed ................................... 330/22

Primary Examiner—Stanley D. Miller, Jr.
Assistant Examiner—B. P. Davis
Attorney, Agent, or Firm—H. Christoffersen; S. Cohen; A. L. Limberg

[57] ABSTRACT

The difference between the base potentials of a pair of transistors which are interconnected at their emitter electrodes and operated with different densities of current flow through their base-emitter junctions, is scaled up by a fixed ratio. The scaled-up potential is applied between the base electrodes of a pair of current divider transistors, the emitter electrodes of which are interconnected to receive input current, to fix the ratio of the currents flowing via their respective collector electrodes.

4 Claims, 2 Drawing Figures

CURRENT DIVIDER

The present invention is directed to current dividers of a nature suitable for construction in a monolithic integrated circuit.

U.S. Pat. No. 3,867,685 issued Feb. 18, 1975 to the present inventor and entitled "Fractional Current Supply" describes a current divider of the same general type as the current divider of the present invention. This prior art current divider uses first and second similar conductivity type transistors operated at substantially the same temperature T, their emitter electrodes being connected to the common terminal of the current divider and their respective collector electrodes to separate ones of the branch terminals of the current divider. A potential proportional to T is applied between the base electrodes of the transistors to maintain their collector-to-emitter (or emitter-to-collector) current flows in fixed ratio. In the prior art current divider, this potential proportional to T is derived as the difference in offset potentials across two chains containing equal numbers of serially-connected self-biased transistors operated at a temperature substantially equal to T, the self-biased transistors in the one chain being forward-biased by a current in fixed proportion to a current forward-biasing the self-biased transistors in the other chain.

U.S. Pat. No. 3,851,241 issued Nov. 26, 1974 to C.F. Wheatley, Jr. and entitled "Temperature Dependent Voltage Reference Circuit" describes the operation of a pair of emitter-coupled transistors with dissimilar densities of current flow through their respective base-emitter junctions to obtain a potential between their respective base electrodes which is linearly related to the absolute temperature T' at which they are operated. More particularly, their respective collector currents are differentially combined to obtain an error signal indicative of the relative densities of current flow through their respective base-emitter junctions differing from the desired relationship, which error signal is applied to an amplifier to obtain a current response applied to the input port of a resistive potential divider. The output port of the current divider is connected between the base electrodes of the emitter-coupled transistors to complete a degenerative feedback loop for maintaining the relative densities of current flow through the respective base-emitter junctions close to a predetermined ratio.

The present invention is embodied in improved current dividers as described in particularly in the claims.

Figure 2:
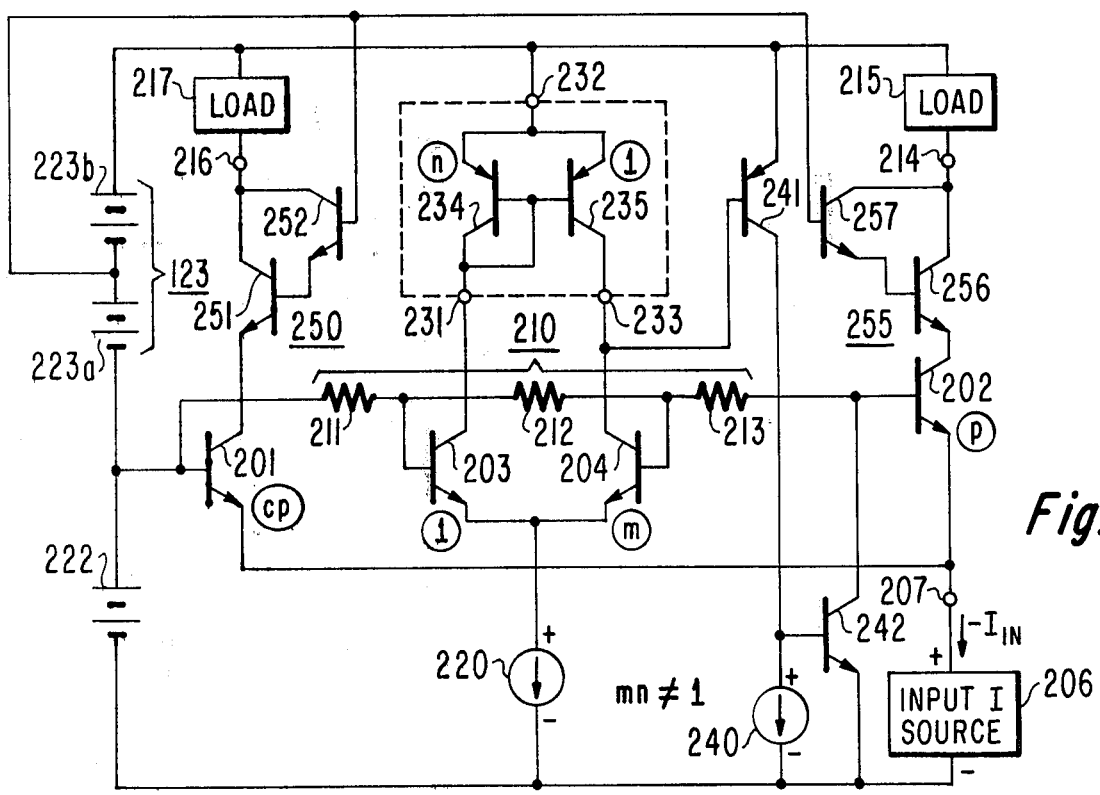

In the drawing:

FIG. 1 is a schematic diagram of a current divider which embodies the present invention; and FIG. 2 is a schematic diagram of a second form of current divider which embodies the present invention.

In FIG. 1, transistors 101 and 102 are the first and second transistors, respectively, of the current divider. Transistors 103 and 104, connected at their emitter electrodes without substantial intervening impedance, are the transistors which are to be operated at different densities of current through their respective base-emitter junctions, thereby to develop a difference between their base potentials which is scaled up and applied between the base electrodes of transistors 101 and 102. The source 106 of input current demands a current $-I_{IN}$ from terminal 107. The emitter electrodes of transistors 101 and 102 are connected without substantial intervening impedance to this terminal and this demand is met by the combined emitter currents $I_{E101}$ and $I_{E102}$ of these transistors. The collector electrodes of transistors 101 and 102 are connected via terminals 116 and 114, respectively, to loads 117 and 115, respectively. In actual practice, quite often only one of these loads is used, usually the one through which the smaller of the collector currents $I_{C101}$ and $I_{C102}$ respectively of transisors 101 and 102 flows, the other being replaced by direct connection.

Serially-connected direct-potential supplies 122 and 123 provides operating potential to the entire current divider circuit of FIG. 1, with supply 122 being included in the means for forward-biasing the base-emitter junctions of transistors 101, 102, 103, 104 and with supply 123 being included in the means for reverse-biasing the collector-base junctions of these transistors. The base electrode of transistor 101 is provided fixed bias potential from the interconnection of the positive and negative terminals of supplies 122 and 123, respectively. The base potential $V_{B102}$ of transistor 102 differs from the base potential $V_{B101}$ of transistor 101 by the potential $(V_{B101} - V_{B102})$ appearing across the input-port of resistive potential divider 110—across the serially connected resistive elements 111, 112, 113. This drop is primarily attributable to a current essentially equal to the difference between the collector current $I_{C142}$ of transistor 142 and current $I_{140}$ demanded by current source 140.

The output port of the potential divider 110, across resistive element 112, is connected between the base electrodes of transistors 103 and 104 to cause the difference between their respective base potentials $V_{B103}$ and $V_{B104}$ to be a fixed fraction of $(V_{B101} - V_{B102})$. A current source 120 withdraws a current $I_{120}$ from the interconnected emitter electrodes of transistors 103 and 104, which is split into two portions flowing respectively as the emitter currents $I_{E103}$ and $I_{E104}$ of transistors 103 and 104. The respective collector currents $I_{C103}$ and $I_{C104}$ of transistors 103 and 104 are related to their respective emitter currents by factors $\alpha_{103}$ and $\alpha_{104}$, each substantially equal to each other and smaller than unity, usually only a few percent. $I_{C104}$ is amplified by a factor $(-n)$ in current mirror amplifier 130 and added to $I_{C103}$ to obtain an error signal indicative of $(V_{BE103} - V_{BE104})$ differing from a prescribed value. This error signal is amplified in the cascade of common-collector amplifier transistor 141 and the ensuing common-emitter amplifier transistor 142 to provide degenerative feedback current. This adjusts the current flowing through the voltage divider 110 to a value to produce a potential drop $(V_{B101} - V_{B102})$ across the input port of potential divider 110, such that the prescribed value of $(V_{B103} - V_{B104})$ will appear at its output port.

The performance of a transistor having a base-emitter junction (such as transistors 101, 102, 103, 104) is in close accordance with the following equation.

$$V_{BE} = (kT/q)\ln (I_E/AJ_S) = (kT/q)\ln (I_C/\alpha AJ_S) \quad (1)$$

where $V_{BE}$ is the base-emitter potential of the transistor, $k$ is Boltzmann's constant, $T$ is the absolute temperature of the base-emitter junction, $q$ is the charge on an electron, $I_E$ is the transistor emitter current, $I_C$ is the transistor collector current smaller than its emitter current by the factor $\alpha$ which approaches unity in value, $A$ is the effective area of the base-emitter junction, $J_S$ is the density of current through the base-emitter junction for $V_{BE} = 0$.

Monolithic integrated circuit transistors simultaneously fabricated in the same basic semiconductor material by the same processing steps have substantially the same $J_S$ and $\alpha$, and transistors located close by each other have substantially identical T. $V_{BE}$, $I_E$, $A$ and $J_S$ will bear the identification numeral of the particular transistors with which they are associated as subscripts. In the drawing, the small encircled numerals or letters near the emitter electrodes of transistors express the ratio of the effective areas of their base-emitter junctions to other transistors of the same conductivity type. The effective areas of the base-emitter junctions of the transistors is related to the actual area of the junctions, the shape of the junctions and to the collection efficiencies of the transistors.

Current amplifier 130 is shown as being of the type commonly khown as a "current mirror amplifier"; it comprises transistors 134, 135 and 136, $A_{134}$ being $n$ times as large as $A_{135}$. Connected emitter-to-emitter at terminal 132, to which supply 116 applies positive potential, and connected base-to-base, transistors 134 and 135 have the same base-emitter potentials causing their respective emitter currents to be in 1:$n$ ratio. There is a 1:$n$ ratio between their respective emitter currents by the same factor, $\alpha_{PNP}$, their common-base forward current gain. Transistor 134 is provided direct coupled collector-to-base feedback by the common-collector-amplifier action of transistor 136. This feedback regulates the base-emitter potential of transistor 134 to cause its collector current to supply the entire collector current demand of transistor 104 except for that relatively small proportion supplied by the base current of transistor 136. A current with amplitude $n$ times that of the collector current of transistor 104 is thus differentially combined with the collector current of transistor 103 to give rise to the error signal applied to the base electrode of transistor 141.

This means that $n$ times as much collector current flows to transistor 103 as to transistor 104 to obtain a zero-valued error signal. If $n$ be greater than one, this is associated with a higher density of current flow through transistor 103 than through transistor 104. The density of current flow through the base-emitter junction of transistor 103 may be increased vis-a-vis that of transistor 104 by making the ratio of $A_{104}/A_{103} = m$ larger than unity, also. These two effects may be used alternatively or cooperatively to increase the density of current flow through the base-emitter junction of transistor 103 over that of transistor 104, thereby to cause $V_{BE103}$ to differ from $V_{BE104}$. That is, in the current scaling apparatus shown in FIG. 1, the product $mn$ differs from unity in value.

Proceeding from equation 1, an expression for the value of the potential difference $(V_{B103} - V_{B104}) = (V_{BE103} - V_{BE104})$ between the base electrodes of transistor 103 and 104 can be derived.

$$V_{BE103} = (kT/q)\ln(I_{C103}/A_{103}J_S) \tag{2}$$

$$V_{BE104} = (kT/q)\ln(I_{C104}/A_{104}J_S) \tag{3}$$

$$(V_{BE103} - V_{BE104}) = (kT/q)\ln(I_{C103}/I_{C104}) + (kT/q)\ln(A_{104}/A_{103}) \tag{4}$$

For the error signal to be zero-valued $I_{C103}$ is as noted above $n$ times as large as $I_{C104}$; and $A_{104}$ is $m$ times $A_{103}$. These observations combine with equation 4 to yield equation 5.

$$(V_{BE103} - V_{BE104}) = (kT/q)\ln(n) + (kT/q)\ln(m) = (kT/q)\ln(mn) \tag{5}$$

The difference between $V_{BE103}$ and $V_{BE104}$ is, as can be seen from equation 5 directly proportional to the operating temperature T of the transistors and substantially independent of the common-emitter forward current gains ($h_{fe}$'s) of the transistors. This means this potential is amenable to being proportionally scaled up for application between the base electrodes of transistors 101 and 102 for providing a constant ratio between their collector currents despite changes in T.

Since substantially the same current flows through each of the resistive elements 111, 112 and 113, the following equation can be written in accordance with Ohm's Law to describe the relationship between $(V_{B101} - V_{B102}) = (V_{BE101} - V_{BE102})$ and $(V_{B103} - V_{B104}) = (V_{BE103} - V_{BE104})$.

$$(V_{BE101} - V_{BE102})/(R_{111} + R_{112} + R_{113}) = (V_{BE103} - V_{BE104})/R_{112} \tag{6}$$

$R_{111}$, $R_{112}$ and $R_{113}$ are the resistances of resistive elements 111, 112 and 113, respectively. An expression for $V_{BE101} - V_{BE102}$ in terms of $I_{C101}$ and $I_{C102}$ can be derived from equation 1 per equations 7, 8 and 9, following.

$$V_{BE101} = (kT/q)\ln(I_{C101}/A_{101}J_S) \tag{7}$$

$$V_{BE102} = (kT/q)\ln(I_{C102}/A_{102}J_S) \tag{8}$$

$$(V_{BE101} - V_{BE102}) = (kT/q)\ln(I_{C101}/I_{C102}) + (kT/9)\ln(A_{102}/A_{101}) = (kT/q)\ln(I_{C101}/I_{C102}) + kT/q(p/pc) = (kT/q)\ln(I_{C101}/cI_{C102}) \tag{9}$$

Substitution of equation 6 into equation 9 yields equation 10, and substitution of equation 5 into equation 10 yields equation 11.

$$(V_{BE103} - V_{BE104})(R_{111} + R_{112} + R_{113})/R_{112} = (kT/q)(I_{C101}/cI_{C102}) \tag{10}$$

$$[(kT/q)(mn)][R_{111} + R_{112} + R_{113}]/R_{112} = (kT/q)(I_{C101}/cI_{C102}) \tag{11}$$

Equation 11 can be rewritten as equation 12.

$$I_{C102} = I_{C101}/c(mn)^{[(R_{111}+R_{112}+R_{113})/R_{112}]} \tag{12}$$

If the product $mn$ has a value modestly larger than unity, a fairly small potential division ratio of $(R_{111} + R_{112} + R_{113})/R_{112}$ will cause $I_{C102}$ to be much smaller than $I_{C101}$. For example—supposing C = 2, $m$ = 5, $n$ = 2, $(R_{111} + R_{112} + R_{113})/R_{112} = 4$—$I_{C102}$ will be $I_{C101}/20000$ to very good approximation. Note particularly that $I_{C102}$ is smaller than $I_{C101}$ by a factor which is substantially independent of temperature and of current levels. Assuming the respective base currents $I_{B101}$ and $I_{B102}$ of transistors 101 and 102 to be negligibly small as compared to their respective collector currents $I_{C101}$ and $I_{C102}$, it can be readily seen and proved that $I_{C101}$ flows to meet the twenty-thousandth part of the current $-I_{IN}$ demanded by source 106, while $I_{C102}$ flows to meet nearly all of the $-I_{IN}$ demand. On the other hand, suppose C and the product $mn$ to have fractional values, in which case $I_{C102}$ will be larger than $I_{C101}$. For example, suppose them to be inversely related to their values as assumed in the previous example. Then, $I_{C102}$ will be 20,000 $I_{C101}$ to good approximation. $I_{C101}$ will, in this latter example, flow to meet the twenty-thousandth part of the current $-I_{IN}$ demanded by source 106, and $I_{C102}$ will flow to meet nearly all of the $-I_{IN}$ demand.

The current scaling apparatus of FIG. 2 differs from that of FIG. 1, primarily in the following particulars. The collector electrodes of transistors 203 and 204 are connected to the input connection 231 and the output connection 233, respectively, of current mirror amplifier 230. Current mirror amplifier 230 has a current gain of $-1/n$ rather than $n$, so the error signal applied to the base electrode of transistor 241 is $-1/n$ times the collector current of transistor 203 plus the collector current of transistor 204. That is, the error signal tends to be smaller by a factor of $n$ times and reversed in polarity with this scheme of differentially combining the collector currents of transistors 203 and 204; as compared with the scheme used in FIG. 1. The cascade of common-emitter amplifier transistors 241 and 242 is a non-inverting amplifier configuration, as contrasted with the inverting amplifier provided by common-collector amplifier transistor 141 and common-emitter amplifier transistor 142 in FIG. 1. The same equations that describe the current scaling apparatus of FIG. 1 describe that of FIG. 2 if one augment each of the numerical subscripts by 100.

Current mirror amplifier 230 includes transistors 234 and 235 connected emitter-to-emitter to its common terminal 232 and connected base-to-base to receive identical base potentials as determined by direct-coupled collector-to-base feedback provided transistor 234 by direct connection 236. The area of the base-emitter junction of transistor 234 is made $n$ times as large as the area of the base-emitter junction of transistor 235, which accounts for current mirror amplifier 230 having the current gain of $-1/n$. The direct connection 236 causes the combined base currents of transistors 234 and 235 to provide a portion of the collector current $I_{C203}$ demanded by transistor 203, making the collector current of transistor 244 and consequently that of transistor 235 somewhat smaller than $-I_{C203}/n$. This error can be compensated for by causing the quiescent base current of transistor 241 to be $(n+1)$ times smaller than the combined quiescent base currents of transistors 234 and 235. To this end, a constant current sink 240 is used to demand a current $(n-1)$ times as small as that demanded by current sink 220, which demand must be met by quiescent current flow from transistor 241 in order that transistor 242 be maintained conductive.

Transistors 201 and 202 are operated with equal collector potentials in the FIG. 2 current divider to reduce the small error in determining the ratio of current division otherwise caused by dissimilar emitter-to-collector potentials of these transistors affecting their relative transconductances. This error is small in transistors with base regions of normal width, but it may be desied to make transistors 201, 202, 203, 204 with narrow-base-regions—i.e., make them so called "punch-through" or super-beta transistors—in which case this error becomes of concern. Super-beta transistors have exceptionally high current gains and reduce (a) the errors caused by the base currents of transistors 203 and 204 in the potential division provided by divider 210 and (b) the errors in current division provided by transistors 201 and 202 due to their base currents. To keep their emitter-to-collector potentials substantially equal, transistors 201 and 202 are connected in cascode connection with composite transistor devices 250 and 255, respectively. The composite transistor device 250 is a Darlinton connection of transistors 251 and 252; composite transistor 255 is a Darlington connection of trasistors 256 and 257. The base electrodes of transistors 252 and 257 are similarly biased, so the combined emitter-follower actions of transistors 252 and 251 bias the collector electrode of transistor 201 to substantially the same potential as the combined emitter-follower actions of transistors 257 and 252 bias the collector electrode of transistor 202.

The small division errors in potential divider 210 (or 110) due to the base currents of transistors 203 and 204 (or 103 and 104) may be reduced, if desired, in ways that do not involve the use of super-beta transistors. Positive feedback methods in which the collector currents of the transistors are sensed and then divided by factors related to the forward current gain of a transistor to provide base compensation currents may be used. The direct connection of the base electrodes of the higher current carrying transistors of the group 201, 202, 203, 204 (or 101, 102, 103, 104) by choosing the resistance of divider element 211 or 213 (or 111 or 113) to be zero-valued reduces divider errors at no cost in die area or simplicity of circuit manufacture.

The nature of the current sources 120, 140, 220, and 240 may be of concern. These current sources may, by way of example, be provided by the collector-to-emitter paths of transistors biased for constant collector current operation. The input current sources 106 and 206 may, for example, be provided by NPN amplifier transistors having their collector electrodes connected to terminals 107 and 207, respectively. The loads 205 and 217 each typically comprises a resistor or an ensuring transistor amplifier stage. The connections described in this paragraph are conventional and fall within the scope of design.

In the FIGS. 1 and 2 circuits, different types of current mirror amplifiers from the amplifier 130 or 230 may be used. While transistors 103 and 104 (or 203 and 204) have been shown as being of the same conductivity type as transistors 101 and 102 (or 201 and 202), useful circuits result when these sets of transistors are of opposite conductivity type but of the same basic semiconductor material. In FIG. 1, the inverting amplifier provided by PNP transistors 141 and 142 can be replaced by a grounded-emitter NPN transistor with its base electrode connected to terminal 133 with suitable potential translating means and its collector electrode connected to the base electrode of transistor 102. In FIG. 2, the non-inverting amplifier provided by elements 240, 241 and 242 can be replaced by an NPN emitter-follower transistor or a plurality of such in cascade. In evaluating the scope of the following claims, the many design modifications possible using the principles set forth in connection with the description of FIGS. 1 and 2 should be borne in mind.

In the circuits embodying the present invention, then, a voltage reference circuit of the general type described by Wheatley is used for scaling up the difference in base-emitter offset potentials of a pair of transistors by a modest scaling factor. A potential difference of only a few tens of millivolts, for example, is scaled up to provide potentials of a few hundreds of millivolt. The resistive potential divider to do this comprises resistors in such close ratio that the scaling up using integrated resistors can be carried out with an accuracy on the order of plus or minus three percent or less. The scaled up potential is suitable for being used to supplant the chains of diodes in his earlier current divider. To this end, temperatures T' of the emitter-coupled pair of transistors in the voltage reference circuit are made equal to the temperature T of the first and second transistors of the current divider.

This can be done, for example, in a monolithic integrated circuit by locating the transistors of the combination in close proximity—by even interdigitating their structures, if desired. In such a monolithic integrated circuit embodiment, one will obtain a current divider with reduced die area, particularly where large current division ratios are sought. The reduced number and area of elements which must be tracked in temperature with the first and second current divider transistors in the voltage reference circuit, as compared with the replaced diode chains, makes it easier to arrange the elements on the die to obtain good tracking of conductance and transconductance characteristics despite temperature change.

What is claimed is:

1. A current divider comprising:
   means for supplying reference, bias and operating potentials;
   first and second and third and fourth transistors, all being of the same basic semiconductor material and operated at substantially the same temperature, each having base and emitter electrodes with a base-emitter junction therebetween and having a collector electrode, said first and said second transistors being of the same conductivity types as each other, said third and said fourth transistors being of the same conductivity type as each other;
   means connecting said third and said fourth transistors in an unbalanced differential-input, single-ended output amplifier configuration;
   means for applying degenerative feedback to said amplifier configurations including:
   a potential divider with an input port connected between the base electrodes of said first and said second transistors and with an output port connected between the base electrodes of said third and fourth transistors, including:
   means for applying said bias potential to the end of the input port of said potential divider to which the base electrode of said first transistor is connected, and including:
   means connecting the single-ended output of said amplifier configuration to the end of the input port of said potential divider to which the base electrode of said second transistor is connected;
   a source of input current connected between said reference potential and an interconnection of the emitter electrodes of said first and said second transistors; and
   means for applying operating potentials to the collector electrodes of said first and said second transistors, including
   a load for conducting the collector current of one of said first and said second transistors as flows in response to said input current.

2. A current divider comprising:
   a common terminal for having an input current, passed therethrough;
   first and second branch terminals for passing first and second fractions of said input current in a ratio determined by the following claimed elements;
   a resistive potential divider having an input port and an output port;
   first and second transistors being of the same basic semiconductor material, being of the same conductivity type as each other, being operated at substantially the same temperature as each other, having respective base electrodes between which the input port of said resistive potential divider is connected, having respective emitter electrodes each directly connected to said common terminal, and having respective collector electrodes connected to separate ones of said first and said second branch terminals;
   third and fourth transistors being of said same basic semiconductor material as said first and second transistors, being operated at substantially the same temperature as each other and said first and said second transistors, being of the same conductivity type as each other, having respective base electrodes between which the output port of said resistive potential divider is connected, having respective emitter electrodes and respective collector electrodes, and having respective base-emitter junctions with respective areas in $l:m$ ratio, $m$ being a positive number;
   a current amplifier having an input terminal to which the collector electrode of said third transistor is direct-coupled, having a common terminal, having an output terminal, and exhibiting a current gain of $-n$ between its input and output terminals, where $n$ is a positive number and where the product of $m$ times $n$ differs from unity, thereby to provide a response current at its output terminal $-n$ times the collector current of said third transistor;
   a source of bias current connected between the common terminal of said current amplifier and an interconnection of the emitter electrodes of said third and said fourth transistors;
   means connected to the output terminal of said current amplifier and to the collector electrode of said fourth transistor for responding to the sum of the collector current of said fourth transistor and the response current $-n$ times the collector current of said third transistor, thereby to provide an error signal, which error signal is applied to the input port of said resistive potential divider to complete a degenerative feedback loop.

3. A current divider comprising:
   a common terminal for having an input current, passed therethrough;
   first and second branch terminals for passing first and second fractions of said input current in a ratio determined by the following claimed elements;
   a resistive potential divider having an input port and an output port;
   first and second transistors being of the same basic semiconductor material, being of the same conductivity type as each other, being operated at substantially the same temperature as each other, having respective base electrodes between which the input port of said resistive potential divider is connected, having respective emitter electrodes each directly connected to said common terminal, and having respective collector electrodes connected to separate ones of said first and said second branch terminals;
   third and fourth transistors being of the same basic semiconductor material as said first and second transistors, being operated at substantially the same temperature as each other and said first and said second transistors, being of the same conductivity type as each other, having respective base electrodes between which the output port of said resistive potential divider is connected, having respective emitter electrodes, having respective collector electrodes, and having respective base-emitter junctions with respective areas in $l{:}m$ ratio, $m$ being a positive number;

a current amplifier having an input terminal to which the collector electrode of said fourth transistor is direct-coupled, having a common terminal, having an output terminal, and exhibiting a current gain of $-1/n$ between its input and output terminals, where $n$ is a positive number and the product of $m$ times $n$ differs from unity, thereby to provide a response current at its output terminal $-1/n$ times the collector current of said fourth transistor;

a source of bias current connected between the common terminal of said current amplifier and an interconnection of the emitter electrodes of said third and said fourth transistors; and means conected to the output terminal of said current amplifier and to the collector electrode of said third transistor for responding to the sum of the collector current of said third transistor and the response current responsive to $-1/n$ times the collector current of said fourth transistor, thereby to provide an error signal, which error signal is applied to the input port of said resistive potential divider to complete a degenerative feedback loop.

4. A current divider comprising, in combination:

first and second transistors of the same conductivity type as each other, each having base and emitter and collector electrodes, and each having a base-emitter junction, said first and said second transistors being connected emitter electrode to emitter electrode;

means for operating said first and said second transistors at difference base-emitter junction current densities to thereby establish a difference in potential between said base electrodes, which is temperature dependent;

means for scaling up said difference in potential by a desired factor, to obtain a scaled up difference in potential which is temperature dependent;

third and fourth transistors of the same conductivity type as each other, each having base, emitter and collector electrodes, each connected emitter electrode to emitter electrode;

means for applying said scaled up difference in potential between the base electrodes of said third and fourth transistors;

means for applying a current, which is to be divided, between an interconnection of the emitter electrodes of said third and said fourth transistors and another interconnection;

a current-conducting path between the collector electrode of said third transistor and said other interconnection;

a current-conducting path between the collector electrode of said fourth transistor and said other interconnection; and means for utilizing a divided portion of said current connected in one of said current-conducting paths.

* * * * *

UNITED STATES PATENT OFFICE
CERTIFICATE OF CORRECTION

PATENT NO. : 4,045,694

DATED : August 30, 1977

INVENTOR(S) : Adel Abdel Aziz Ahmed

It is certified that error appears in the above-identified patent and that said Letters Patent are hereby corrected as shown below:

Column 1, line 51, change "particularly" to --particularity--. Column 3, line 62, change "sistor" to --sistors--. Column 4, equation (9), line 1, change "(kT/9)" --(kT/q)--. Column 5, line 47, change "(n-1)" to --(n+1)--; line 57, change "desied" to --desired--. Column 7, line 3, change "temperatures" to --temperature--. Column 9, line 25, change "conected" to --connected--.

Signed and Sealed this

Third Day of January 1978

[SEAL]

Attest:

RUTH C. MASON
*Attesting Officer*

LUTRELLE F. PARKER
*Acting Commissioner of Patents and Trademarks*